(12) United States Patent
Takita

(10) Patent No.: US 9,964,848 B2
(45) Date of Patent: May 8, 2018

(54) POSITIVE PHOTOSENSITIVE RESIN COMPOSITION AND CURED FILM FORMING METHOD USING THE SAME

(71) Applicant: FUJIFILM Corporation, Minato-ku, Tokyo (JP)

(72) Inventor: Satoshi Takita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 504 days.

(21) Appl. No.: 14/684,812

(22) Filed: Apr. 13, 2015

(65) Prior Publication Data

US 2015/0212406 A1    Jul. 30, 2015

Related U.S. Application Data

(63) Continuation of application No. 12/680,273, filed as application No. PCT/JP2008/067496 on Sep. 26, 2008, now Pat. No. 9,034,440.

(30) Foreign Application Priority Data

Sep. 28, 2007 (JP) ................. 2007-256203
Sep. 25, 2008 (JP) ................. 2008-246883

(51) Int. Cl.
| G03F 7/039 | (2006.01) |
| G03F 7/004 | (2006.01) |
| G03F 7/40  | (2006.01) |
| G03F 7/20  | (2006.01) |

(52) U.S. Cl.
CPC ............ G03F 7/004 (2013.01); G03F 7/0045 (2013.01); G03F 7/0392 (2013.01); G03F 7/20 (2013.01); G03F 7/40 (2013.01); B32B 2457/202 (2013.01); B32B 2457/206 (2013.01); Y10T 428/10 (2015.01); Y10T 428/24802 (2015.01)

(58) Field of Classification Search
None
See application file for complete search history.

(56) References Cited

U.S. PATENT DOCUMENTS

| 4,074,008 | A  | 2/1978  | Green |
| 5,362,597 | A  | 11/1994 | Sano et al. |
| 5,985,510 | A  | 11/1999 | Akutsu et al. |
| 6,004,724 | A  | 12/1999 | Yamato et al. |
| 6,017,675 | A  | 1/2000  | Dietliker et al. |
| 6,232,038 | B1 | 5/2001  | Takasaki et al. |
| 6,479,209 | B1 | 11/2002 | Aoai et al. |
| 2002/0020832 | A1 | 2/2002 | Oka et al. |
| 2002/0168584 | A1 | 11/2002 | Aoai et al. |
| 2004/0023120 | A1 | 2/2004 | Nishikubo et al. |
| 2006/0246377 | A1 | 11/2006 | Yamato et al. |
| 2006/0275700 | A1 | 12/2006 | Lee et al. |
| 2007/0218403 | A1 | 9/2007 | Maeda et al. |
| 2009/0226850 | A1 | 10/2009 | Misumi et al. |
| 2010/0104972 | A1 | 4/2010 | Watanabe et al. |
| 2010/0173246 | A1 | 7/2010 | Takita |
| 2011/0177302 | A1 | 7/2011 | Takita |
| 2013/0071787 | A1 | 3/2013 | Takita |

FOREIGN PATENT DOCUMENTS

| EP | 0877293 A2 | 11/1998 |
| JP | 05-165214 A | 7/1993 |
| JP | 10-153854 A | 6/1998 |
| JP | 2002-508774 A | 3/2002 |
| JP | 2003-195506 A | 7/2003 |
| JP | 2004-004669 A | 1/2004 |
| JP | 2004-264623 A | 9/2004 |
| JP | 2005017321 A | 1/2005 |
| JP | 2006-154569 A | 6/2006 |
| JP | 2006-178317 A | 7/2006 |
| JP | 2006-251296 | 9/2006 |
| JP | 2007033518 A | 2/2007 |
| JP | 2007-128062 A | 5/2007 |
| JP | 2007147809 A | 6/2007 |
| JP | 2007-186680 A | 7/2007 |
| WO | 2005052688 A2 | 6/2005 |
| WO | 2007015352 A1 | 2/2007 |

OTHER PUBLICATIONS

Clearly marked English translation of JP 2006-251296 a from Parent application with addition of "English translation of JP 2006-251296 a obtained from Parent U.S. Appl. No. 12/680,273" dated Sep. 1, 2017, 28 pages. (Year: 2017).*
English abstract and registry compounds attached thereto from Scifinder database for JP 2006-251296 a obtained Sep. 1, 2017, 43 pages. (Year: 2017).*
English translation of JP 2004-264623 a (2004) from machine translation from AIPN Japan Patent Office National Center for Industrial Property Information and Training, generated Oct. 12, 2017, 24 pages. (Year: 2017).*
International Search Report (PCT/ISA/210), for PCT/JP2008/067496, dated Oct. 28, 2008.
International Preliminary Examination Report (PCT/IDS/237), for PCT/JP2008/067496, dated Oct. 28, 2008.
Communication dated May 2, 2012 from the European Patent Office in counterpart European application No. 08833502.1.
Watanabe, Eiji, JP 2007147809 A English Machine Translation provided by http://dossier1.ipdl.inpit.go.jp/APIN/odse_top_dn.ipdl?N0000=7400.

(Continued)

*Primary Examiner* — Cynthia Hamilton
(74) *Attorney, Agent, or Firm* — Sughrue Mion, PLLC

(57) ABSTRACT

There are provided a positive photosensitive resin composition excellent in the sensitivity, film residual ratio and storage stability, comprising a resin containing a specific acrylic acid-based constituent unit capable of dissociating an acid-dissociable group to produce a carboxyl group, the resin being alkali-insoluble or sparingly alkali-soluble and becoming alkali-soluble when the acid-dissociable group dissociates, a resin containing a constituent unit having a functional group capable of reacting with the carboxyl group to form a covalent bond, and a compound capable of generating an acid upon irradiation with an actinic ray or radiation; a cured film forming method using the positive photosensitive resin composition; and a cured film excellent in the heat resistance, adhesion, transmittance and the like.

12 Claims, No Drawings

(56) References Cited

OTHER PUBLICATIONS

Endo et al, JP 2007033518 A English machine translation provided by http://dossier1.ipdl.inpit.go.jp/APIN/odse_top_dn.ipdl?N0000=7400.
JP2006-251296, Murayama et al., English translation.

* cited by examiner

POSITIVE PHOTOSENSITIVE RESIN COMPOSITION AND CURED FILM FORMING METHOD USING THE SAME

This is a Continuation Application of U.S. application Ser. No. 12/680,273 filed Sep. 7, 2010, which is a U.S. national stage entry of International Application No. PCT/JP2008/067496 filed Sep. 26, 2008 and claims priority under 35 U.S.C. § 119 from JP Application No. 2007-256203 filed Sep. 28, 2007 and JP Application No. 2008-246883 filed Sep. 25, 2008, the disclosures of which are incorporated herein by reference.

TECHNICAL FIELD

The present invention relates to a positive photosensitive resin composition and a cured film forming method using the same. More specifically, the present invention relates to a positive photosensitive resin composition suitable for the formation of a flattening film, protective film or interlayer insulating film of electronic components such as liquid crystal display device, integrated circuit device, solid-state imaging device and organic EL, and a cured film forming method using the same.

BACKGROUND ART

Conventionally, in electronic components such as liquid crystal display device, integrated circuit device, solid-state imaging device and organic EL, a photosensitive resin composition is generally used when forming a flattening film for imparting flatness to a surface of the electronic component, a protective film for preventing deterioration or damage of the electronic component, or an interlayer insulating film for keeping insulation. For example, in the production of a TFT liquid crystal display device, a backplate is fabricated by providing a polarizing plate on a glass substrate, forming a transparent electroconductive circuit layer such as ITO and a thin film transistor (TFT) thereon, and covering the transistor with an interlayer insulating film, a top plate is fabricated by providing a polarizing plate on a glass substrate, forming, if desired, patterns of a black matrix layer and a color filter layer, and further forming sequentially a transparent electroconductive circuit layer and an interlayer insulating film, and after disposing these two plates to oppose through a spacer, a liquid crystal is sealed in between the backplate and the top plate. In this process, the photosensitive resin composition used when forming the interlayer insulating film is required to be excellent in the sensitivity, residual film ratio, heat resistance, adhesion and transparency. Also, excellent aging stability during storage is required of the photosensitive resin composition.

As regards the photosensitive resin composition, for example, Patent Document 1 proposes a photosensitive resin composition containing (A) a resin soluble in an aqueous alkali solution, which is a polymer of (a) an unsaturated carboxylic acid or an unsaturated carboxylic anhydride, (b) an epoxy group-containing radical polymerizable compound and (c) another radical polymerizable compound, and (B) a radiation-sensitive acid-producing compound, and Patent Document 2 proposes a photosensitive resin composition containing an alkali-soluble acrylic polymer binder, a quinonediazide group-containing compound, a crosslinking agent and a photo-acid generator. However, both of these compositions are insufficient in terms of sensitivity, residual film ratio of the unexposed area, resolution and aging stability and are not enough for producing a high-quality liquid crystal display device. Patent Document 3 proposes a positive chemical amplification resist composition containing a crosslinking agent, an acid generator and a resin having a protective group capable of being cleaved by the action of an acid, where the resin itself is insoluble or sparingly soluble in an aqueous alkali solution but becomes soluble in an aqueous alkali solution after cleavage of the protective group. However, this composition is insufficient in terms of adhesion or transmittance and is not enough for producing a high-quality liquid crystal display device. Patent Document 4 proposes a radiation-sensitive resin composition containing an acid generator and a resin having an acetal structure and/or a ketal structure and an epoxy group, but this composition is low in the sensitivity and is not good.

Patent Document 1: JP-A-5-165214
Patent Document 2: JP-A-10-153854
Patent Document 3: JP-A-2004-4669
Patent Document 4: JP-A-2004-264623

DISCLOSURE OF THE INVENTION

Problems that the Invention is to Solve

Accordingly, an object of the present invention is to provide a positive photosensitive resin composition excellent in the sensitivity, residual film ratio and storage stability, and a cured film forming method using the same, which are a positive photosensitive resin composition ensuring that when cured, a cured film excellent in the heat resistance, adhesion, transmittance and the like is obtained, and a cured film forming method using the same.

Another object of the present invention is to provide a cured film obtained using the cured film forming method, and a liquid crystal display device, integrated circuit device, solid-state imaging device or organic EL device having the cured film.

Means for Solving the Problems

The present inventors have made intensive studies to attain the above-described objects, as a result, the present invention has been accomplished.

The present invention is as follows.

(1) A positive photosensitive resin composition comprising (A1) a resin containing a constituent unit represented by the following formula (1) having an acid-dissociable group, the resin being alkali-insoluble or sparingly alkali-soluble and becoming alkali-soluble when the acid-dissociable group dissociates, (A2) a resin containing a constituent unit having a functional group capable of reacting with a carboxyl group to form a covalent bond, and (B) a compound capable of generating an acid upon irradiation with an actinic ray or radiation:

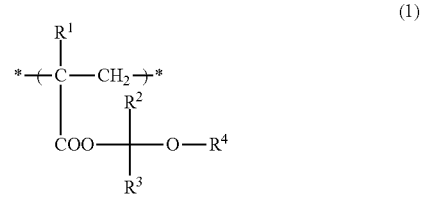

wherein $R^1$ represents a hydrogen atom, a methyl group, a halogen atom or a cyano group, each of $R^2$ and $R^3$ independently represents a hydrogen atom, a linear or branched alkyl group, or a cycloalkyl group, provided that at least one of $R^2$ and $R^3$ represents a linear or branched alkyl group or a cycloalkyl group, $R^4$ represents a linear or branched alkyl group which may be substituted, a cycloalkyl group which may be substituted, or an aralkyl group which may be substituted, and $R^2$ or $R^3$ may combine with $R^4$ to form a cyclic ether.

(2) The positive photosensitive resin composition as described in (1) above, wherein the component (B) is a compound capable of generating an acid upon irradiation with an actinic ray at a wavelength of 300 nm or more.

(3) The positive photosensitive resin composition as claimed in claim 1 or 2, wherein the component (B) is a compound containing an oxime sulfonate group represented by the following formula (2):

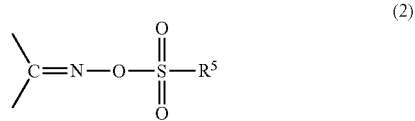

(2)

wherein $R^5$ represents a linear or branched alkyl group which may be substituted, a cycloalkyl group which may be substituted, or an aryl group which may be substituted.

(4) The positive photosensitive resin composition as described in any one of (1) to (3) above, wherein the component (B) is a compound represented by the following formula (3):

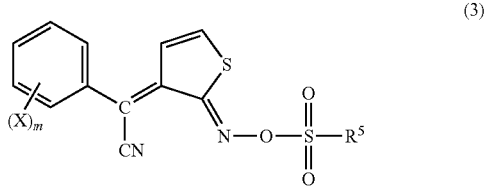

(3)

wherein $R^5$ is the same as $R^5$ in formula (2),

X represents a linear or branched alkyl group, an alkoxy group or a halogen atom, m represents an integer of 0 to 3, and when m is 2 or 3, each X may be the same as or different from every other X.

(5) The positive photosensitive resin composition as described in any one of (1) to (4) above, which further comprises (C) an adhesion aid.

(6) The positive photosensitive resin composition as described in any one of (1) to (5) above, wherein the component (A2) contains a constituent unit having a functional group capable of reacting with a carboxyl group to form a covalent bond and a constituent unit represented by formula (1).

(7) A cured film forming method comprising a step of applying the positive photosensitive resin composition described in any one of (1) to (6) above on a substrate and drying it to form a coating film, a step of exposing the coating film to an actinic ray or radiation through a mask, a step of developing the exposed film with an alkali developer to form a pattern, and a step of heat-treating the obtained pattern.

(8) The cured film forming method as described in (7) above, further comprising a step of exposing the entire surface of the film, after the step of developing the coating film with an alkali developer to form a pattern but before the step of heat-treating the obtained pattern.

(9) A cured film formed by using the cured film forming method described in (7) or (8) above.

(10) A liquid crystal display device having the cured film described in (9) above.

(11) An integrated circuit device having the cured film described in (9) above.

(12) A solid-state imaging device having the cured film described in (9) above.

(13) An organic EL device having the cured film described in (9) above.

Furthermore, preferred embodiments of the present invention are set forth below.

(14) The positive photosensitive resin composition as described in any one of (1) to (6) above, wherein the component (B) is contained in an amount of 0.1 to 10 parts by mass per total 100 parts by mass of the components (A1) and (A2).

(15) The positive photosensitive resin composition as described in any one of (1) to (6) and (14) above, wherein the component (C) is contained in an amount of 0.1 to 20 parts by mass per total 100 parts by mass of the components (A1) and (A2).

Advantage of the Invention

According to the present invention, there can be provided a positive photosensitive resin composition excellent in the sensitivity, residual film ratio and storage stability and a cured film forming method using the same, which are a positive photosensitive resin composition ensuring that when cured, a cured film excellent in the heat resistance, adhesion, transmittance and the like is obtained, and a cured film forming method using the same.

BEST MODE FOR CARRYING OUT THE INVENTION

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The positive photosensitive resin composition of the present invention is characterized by containing two kinds of specific resins as the resin component and a compound capable of generating an acid upon irradiation with an actinic ray or radiation.

(A) Resin Component

The resin component (A) contained in the positive photosensitive resin composition of the present invention includes a resin containing a constituent unit represented by formula (1), the resin being alkali-insoluble or sparingly alkali-soluble and becoming alkali-soluble when the acid-dissociable group dissociates (sometimes referred to as a "component (A1)"), and a resin containing a constituent unit having a functional group capable of reacting with a carboxyl group to form a covalent bond (sometimes referred to as a "component (A2)"), and other resins may be further contained. The "acid-dissociable group" as used herein indicates a functional group that can dissociate in the presence of an acid. Here, the component (A2), that is, the resin containing a constituent unit having a functional group capable of reacting with a carboxyl group to form a covalent bond, may further contain a constituent unit containing a constituent unit represented by formula (1), but the resin is regarded as the component (A2).

Component (A1):

The component (A1) is a resin containing a constituent unit represented by formula (1), the resin being alkali-insoluble or sparingly alkali-soluble and becoming alkali-soluble when the acid-dissociable group dissociates.

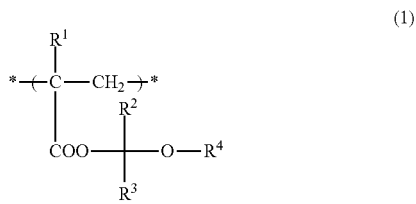

In formula (1), $R^1$ represents a hydrogen atom, a methyl group, a halogen atom or a cyano group.

Each of $R^2$ and $R^3$ independently represents a hydrogen atom, a linear or branched alkyl group, or a cycloalkyl group, provided that at least one of $R^2$ and $R^3$ represents an alkyl group or a cycloalkyl group.

$R^4$ represents a linear or branched alkyl group which may be substituted, a cycloalkyl group which may be substituted, or an aralkyl group which may be substituted.

$R^2$ or $R^3$ may combine with $R^4$ to form a cyclic ether.

The alkyl group, cycloalkyl group and aralkyl group as $R^4$ may have a substituent, and examples of the substituent include an alkyl group, an alkoxy group and a halogen atom. The carbon number of the substituent is preferably 6 or less.

In formula (1), $R^1$ is preferably a hydrogen atom or a methyl group.

The alkyl group as $R^2$ and $R^3$ is preferably a linear or branched alkyl group having a carbon number of 1 to 6.

The cycloalkyl group as $R^2$ and $R^3$ is preferably a cycloalkyl group having a carbon number of 3 to 6. The alkyl group as $R^4$ is preferably a linear or branched alkyl group having a carbon number of 1 to 10.

The cycloalkyl group as $R^4$ is preferably a cycloalkyl group having a carbon number of 3 to 10.

The aralkyl group as $R^4$ is preferably an aralkyl group having a carbon number of 7 to 10.

In the case where $R^2$ or $R^3$ combines with $R^4$ to form a cyclic ether, it is preferred to form an alkylene chain having a carbon number of 2 to 5 by combining $R^2$ or $R^3$ with $R^4$.

Examples of the radical polymerizable monomer used for forming the constituent unit represented by formula (1) include a 1-alkoxyalkyl acrylate, a 1-alkoxyalkyl methacrylate, a 1-(haloalkoxy)alkyl acrylate, a 1-(haloalkoxy)alkyl methacrylate, a 1-(aralkyloxy)alkyl acrylate, a 1-(aralkyloxy)alkyl methacrylate, a tetrahydropyranyl acrylate and a tetrahydropyranyl methacrylate. Among these, a 1-alkoxyalkyl acrylate, a 1-alkoxyalkyl methacrylate, a tetrahydropyranyl acrylate and a tetrahydropyranyl methacrylate are preferred, and a 1-alkoxyalkyl acrylate and a 1-alkoxyalkyl methacrylate are more preferred.

Specific examples of the radical polymerizable monomer used for forming the constituent unit represented by formula (1) include 1-ethoxyethyl methacrylate, 1-ethoxyethyl acrylate, 1-methoxyethyl methacrylate, 1-methoxyethyl acrylate, 1-n-butoxyethyl methacrylate, 1-n-butoxyethyl acrylate, 1-isobutoxyethyl methacrylate, 1-(2-chloroethoxy)ethyl methacrylate, 1-(2-ethylhexyloxy)ethyl methacrylate, 1-n-propoxyethyl methacrylate, 1-cyclohexyloxyethyl methacrylate, 1-(2-cyclohexylethoxy)ethyl methacrylate and 1-benzyloxyethyl methacrylate. One of these monomers may be use alone, or two or more kinds thereof may be used in combination.

The radical polymerizable monomer used for forming the constituent unit represented by formula (1) may be a commercially available product or may be synthesized by a known method. For example, the monomer can be synthesized by reacting a (meth)acrylic acid with a vinyl ether in the presence of an acid catalyst as shown below.

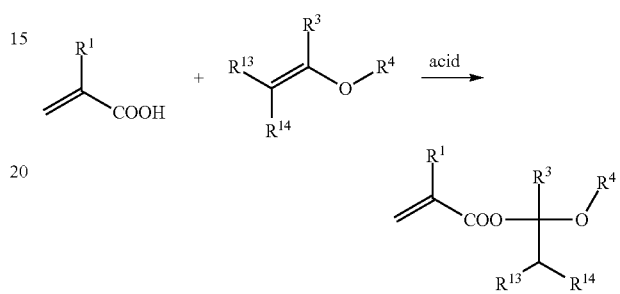

wherein $R^1$, $R^3$ and $R^4$ correspond to $R^1$, $R^3$ and $R^4$ in formula (1), and $R^{13}$ and $R^{14}$ as —CH($R^{13}$)($R^{14}$) correspond to $R^2$ in formula (1).

In the component (A1), a monomer having a constituent unit other than the monomer for forming the constituent unit represented by formula (1) may be copolymerized, if desired.

Examples of the constituent unit other than the constituent unit represented by formula (1) include constituent units composed of styrene, tert-butoxystyrene, methylstyrene, hydroxystyrene, α-methylstyrene, acetoxystyrene, α-methyl-acetoxystyrene, methoxystyrene, ethoxystyrene, chlorostyrene, methyl vinylbenzoate, ethyl vinylbenzoate, acrylic acid, methacrylic acid, methyl acrylate, methyl methacrylate, ethyl acrylate, ethyl methacrylate, n-propyl acrylate, n-propyl methacrylate, isopropyl acrylate, isopropyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, benzyl acrylate, benzyl methacrylate, isobornyl acrylate, isobornyl methacrylate, glycidyl methacrylate or acrylonitrile. One of these monomers may be used alone, or two or more kinds thereof may be used in combination.

The content of the constituent unit represented by formula (1) in the repeating unit constituting the component (A1) is preferably from 10 to 100 mol %, more preferably from 20 to 90 mol %, still more preferably from 30 to 80 mol %.

The molecular weight of the component (A1) is, as the polystyrene-equivalent weight average molecular weight, preferably from 1,000 to 200,000, more preferably from 2,000 to 50,000.

As for the component (A1), a mixture of two or more kinds of resins containing different constituent units may be used, or a mixture of two or more kinds of resins containing the same constituent unit and differing in the composition may be used.

Also, as for the synthesis method of the component (A1), various methods are known, and, for example, a radical polymerizable monomer mixture containing at least a radical polymerizable monomer used for forming the constituent unit represented by formula (1) is polymerized in an organic solvent by using a radical polymerization initiator, whereby the resin can be synthesized.

Component (A2):

The component (A2) is a resin containing a constituent unit having a functional group capable of reacting with a carboxyl group to form a covalent bond.

Examples of the functional group capable of reacting with a carboxyl group to form a covalent bond include an epoxy group and an oxetane group, with an epoxy group being preferred.

The monomer used for synthesizing a resin containing a constituent unit having a functional group capable of reacting with a carboxyl group to form a covalent bond is preferably a radical polymerizable monomer represented by any one of the following formulae (3) to (5). The molecular weight of the radical polymerizable monomer represented by any one of formulae (3) to (5) is preferably from 100 to 500, more preferably from 120 to 200.

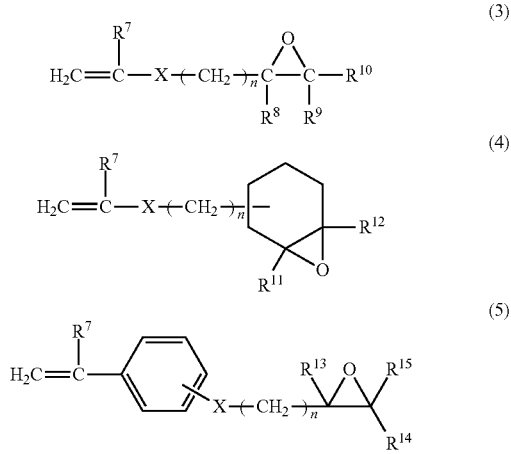

In formulae (3) to (5), X represents a divalent linking group, and examples thereof include —O—, —S— and an organic group such as —COO— and —OCH$_2$COO—.

$R^7$ represents a hydrogen atom, a methyl group or a halogen atom and is preferably a hydrogen atom or a methyl group.

Each of $R^8$, $R^9$, $R^{10}$, $R^{11}$, $R^{12}$, $R^{13}$, $R^{14}$ and $R^{15}$ independently represents a hydrogen atom or an alkyl group and is preferably a hydrogen atom or a methyl group.

n is an integer of 1 to 10.

Specific examples of the radical polymerizable monomer used for forming the constituent unit containing an epoxy group as the functional group capable of reacting with a carboxyl group to form a covalent bond include (meth)acrylates such as glycidyl acrylate, glycidyl methacrylate, 3,4-epoxybutyl acrylate, 3,4-epoxybutyl methacrylate, 4,5-epoxypentyl acrylate, 4,5-epoxypentyl methacrylate, 6,7-epoxyheptyl acrylate and 6,7-epoxyheptyl methacrylate; vinylbenzyl glycidyl ethers such as o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether and α-methyl-p-vinylbenzyl glycidyl ether; vinylphenyl glycidyl ethers such as o-vinylphenyl glycidyl ether, m-vinylphenyl glycidyl ether and p-vinylphenyl glycidyl ether; 3,4-epoxycyclohexylmethyl acrylate; and 3,4-epoxycyclohexylmethyl methacrylate. Among these monomers, glycidyl acrylate, glycidyl methacrylate, p-vinylphenyl glycidyl ether, 3,4-epoxycyclohexylmethyl acrylate and 3,4-epoxycyclohexylmethyl methacrylate are preferred, and glycidyl acrylate and glycidyl methacrylate are more preferred.

Also, a constituent unit having an oxetane group as the functional group may be formed using a compound where the epoxy group in those specific examples of the compound having an epoxy group as the functional group is replaced by an oxetane group.

The radical polymerizable monomer used for forming the constituent unit having a functional group capable of reacting with a carboxyl group to form a covalent bond may be a commercially available product or may be synthesized by a known method.

In the component (A2), a monomer having a constituent unit other than the radical polymerizable monomer used for forming the constituent unit having a functional group capable of reacting with a carboxyl group to form a covalent bond may be copolymerized, if desired.

Examples of such a constituent unit include constituent units composed of styrene, tert-butoxystyrene, methylstyrene, hydroxystyrene, α-methylstyrene, acetoxystyrene, α-methyl-acetoxystyrene, methoxystyrene, ethoxystyrene, chlorostyrene, methyl vinylbenzoate, ethyl vinylbenzoate, acrylic acid, methacrylic acid, methyl acrylate, methyl methacrylate, ethyl acrylate, ethyl methacrylate, n-propyl acrylate, n-propyl methacrylate, isopropyl acrylate, isopropyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, benzyl acrylate, benzyl methacrylate, isobornyl acrylate, isobornyl methacrylate, glycidyl methacrylate or acrylonitrile. Furthermore, a "monomer capable of forming a constituent unit represented by formula (1)" can be copolymerized.

One of these monomers may be used alone, or two or more kinds thereof may be used in combination.

In the repeating unit constituting the component (A2), the content of the constituent unit having a functional group capable of reacting with a carboxyl group to form a covalent bond is preferably from 10 to 90 mol %, more preferably from 20 to 80 mol %, still more preferably from 30 to 70 mol %.

In the repeating unit constituting the component (A2), the content of the constituent unit represented by formula (1) is preferably from 0 to 70 mol %, more preferably from 5 to 50 mol %.

The molecular weight of the component (A2) is, as the polystyrene-equivalent weight average molecular weight, preferably from 1,000 to 200,000, more preferably from 2,000 to 50,000.

As for the component (A2), a mixture of two or more kinds of resins containing different constituent units may be used, or a mixture of two or more kinds of resins containing the same constituent unit and differing in the composition may be used.

Also, as for the synthesis method of the component (A2), various methods are known, and, for example, a radical polymerizable monomer mixture containing at least a radical polymerizable monomer used for forming the constituent unit having a functional group capable of reacting a carboxyl group to form a covalent bond is polymerized in an organic solvent by using a radical polymerization initiator, whereby the resin can be synthesized.

The ratio by mass between the component (A1) and the component (A2) is preferably from 20:80 to 80:20, more preferably from 30:70 to 70:30.

Incidentally, the composition of the present invention may contain a resin other than the component (A1) and the component (A2), and the content of the resin other than the component (A1) and the component (A2) is preferably 30 parts by mass or less per total 100 parts by mass of the components (A1) and (A2).

In all repeating units of all resins constituting the component (A), the content of the constituent unit represented by formula (1) is preferably from 10 to 90 mol %, more preferably from 20 to 50 mol %.

The content of the constituent unit having a functional group capable of reacting with a carboxyl group to form a covalent bond is preferably from 5 to 50 mol %, more preferably from 10 to 40 mol %.

The content of the constituent unit other than the constituent unit represented by formula (1) and the constituent unit having a functional group capable of reacting with a carboxyl group to form a covalent bond is, as a total amount, preferably 85 mol % or less, more preferably 70 mol % or less, based on all repeating units of all resins constituting the component (A).

(B) Compound Capable of Generating an Acid Upon Irradiation with an Actinic Ray or Radiation Examples of the compound capable of generating an acid upon irradiation with an actinic ray or radiation (sometimes referred to as a "component (B)") for use in the present invention include a sulfonium salt, an iodonium salt, a diazomethane compound, an imidosulfonate compound and an oxime sulfonate compound. One of these compounds may be used alone, or two or more kinds thereof may be used in combination.

The component (B) is preferably a compound that is sensitized with an actinic ray at 300 nm or more to generate an acid, more preferably a compound containing an oxime sulfonate group represented by the following formula (2):

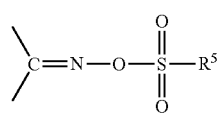
(2)

In formula (2), $R^5$ represents a linear or branched alkyl group which may be substituted, a cycloalkyl group which may be substituted, or an aryl group which may be substituted.

$R^5$ is preferably a linear or branched alkyl group which may be substituted, or an aryl group which may be substituted.

The alkyl group of $R^5$ is preferably a linear or branched alkyl group having a carbon number of 1 to 10, and the cycloalkyl group is preferably a cycloalkyl group having a carbon number of 3 to 10.

The alkyl group and cycloalkyl group of $R^5$ may be substituted, for example, by an alkoxy group having a carbon number of 1 to 10 or an alicyclic group (including a crosslinked alicyclic group such as 7,7-dimethyl-2-oxonorbornyl group; preferably a bicycloalkyl group or the like).

The aryl group of $R^5$ is preferably an aryl group having a carbon number of 6 to 11, more preferably a phenyl group or a naphthyl group. The aryl group of $R^5$ may be substituted, for example, by an alkyl group having a carbon number of 1 to 5, an alkoxy group or a halogen atom.

The compound containing an oxime sulfonate group represented by formula (2) is more preferably an oxime sulfonate compound represented by the following formula (3):

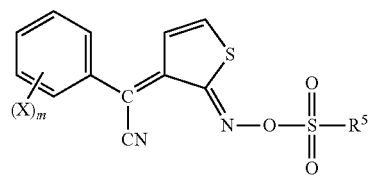
(3)

In formula (3), $R^5$ is the same as $R^5$ in formula (2).

X represents a linear or branched alkyl group, an alkoxy group or a halogen atom.

m represents an integer of 0 to 3, and when m is 2 or 3, each X may be the same as or different from every other X.

The alkyl group as X is preferably a linear or branched alkyl group having a carbon number of 1 to 4.

The alkoxy group as X is preferably a linear or branched alkoxy group having a carbon number of 1 to 4.

The halogen atom as X is preferably a chlorine atom or a fluorine atom.

m is preferably 0 or 1.

In particular, a compound where in formula (3), m is 1, X is a methyl group and the substitution position of X is the ortho-position, is preferred.

Specific examples of the oxime sulfonate compound include the following compound (i), compound (ii), compound (iii), compound (iv) and compound (v). One of these compounds may be used alone, or two or more kinds thereof may be used in combination. Also, the compound may be used in combination with another kind of the component (B).

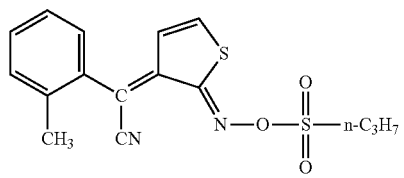
(i)

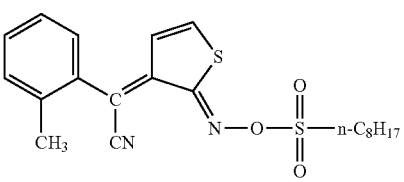
(ii)

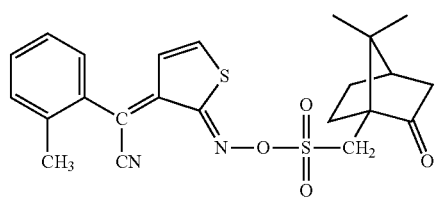
(iii)

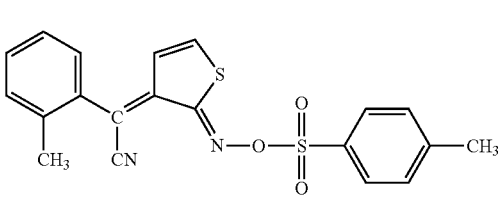
(iv)

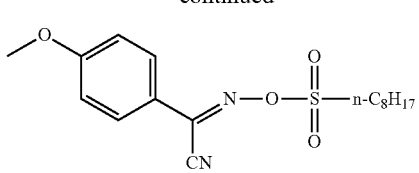

(v)

Compounds (i) to (v) are available as a commercial product.

(C) Adhesion Aid

The adhesion aid (C) for use in the present invention is a compound for enhancing adhesion of an insulating film to an inorganic material working out to a substrate, for example, a silicon compound such as silicon, silicon oxide and silicon nitride, or a metal such as gold, copper and aluminum. Specific examples thereof include a silane coupling agent and a thiol-based compound.

The silane coupling agent as the adhesion aid for use in the present invention is intended to modify the interface and is not particularly limited, and a known silane coupling agent may be used.

Preferred examples of the silane coupling agent include γ-glycidoxypropyltrialkoxysilane, γ-glycidoxypropylalkyldialkoxysilane, γ-methacryloxypropyltrialkoxysilane, γ-methacryloxypropylalkyldialkoxysilane, γ-chloropropyltrialkoxysilane, γ-mercaptopropyltrialkoxysilane, β-(3,4-epoxycyclohexypethyltrialkoxysilane and vinyltrialkoxysilane.

Among these, γ-glycidoxypropyltrialkoxysilane and γ-methacryloxypropyltrialkoxysilane are more preferred, and γ-glycidoxypropyltrialkoxysilane is still more preferred.

One of these silane coupling agents may be used alone, or two or more kinds thereof may be used in combination. These are effective not only for enhancing the adhesion to a substrate but also for adjusting the taper angle with the substrate.

In the positive photosensitive resin composition of the present invention, as for the mixing ratio of the component (A), component (B) and component (C), the ratio of the component (B) is preferably from 0.1 to 10 parts by mass, more preferably from 0.5 to 5 parts by mass, and the ratio of the component (C) is preferably from 0.1 to 20 parts by mass, more preferably from 0.5 to 10 parts by mass, per total 100 parts by mass of the components (A1) and (A2).

<Other Components>

In the positive photosensitive resin composition of the present invention, in addition to the component (A), component (B) and component (C), a basic compound, a surfactant, an ultraviolet absorber, a sensitizer, a plasticizer, a thickener, an organic solvent, an organic or inorganic precipitation inhibitor, and the like may be added, if desired.

<Basic Compound>

The basic compound which can be used may be arbitrarily selected from those used in chemical amplification resists. Examples thereof include an aliphatic amine, an aromatic amine, a heterocyclic amine, a quaternary ammonium hydroxide and a quaternary ammonium carboxylate.

Examples of the aliphatic amine include trimethylamine, diethylamine, triethylamine, di-n-propylamine, tri-n-propylamine, di-n-pentylamine, tri-n-pentylamine, diethanolamine, triethanolamine, dicyclohexylamine and dicyclohexylmethylamine.

Examples of the aromatic amine include aniline, benzylamine, N,N-dimethylaniline and diphenylamine.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinamide, quinoline, 8-oxyquinoline, pyrazine, pyrazole, pyridazine, purine, pyrrolidine, piperidine, piperazine, morpholine, 4-methylmorpholine, 1,5-diazabicyclo[4,3.0]-5-nonene and 1,8-diazabicyclo[5,3,0]-7-undecene.

Examples of the quaternary ammonium hydroxide include tetramethylammonium hydroxide, tetraethylammonium hydroxide, tetra-n-butylammonium hydroxide and tetra-n-hexylammonium hydroxide.

Examples of the quaternary ammonium carboxylate include tetramethylammonium acetate, tetramethylammonium benzoate, tetra-n-butylammonium acetate and tetra-n-butylammonium benzoate.

The amount of the basic compound blended is preferably from 0.001 to 1 part by mass, more preferably from 0.005 to 0.2 parts by mass, per total 100 parts by mass of the components (A1) and (A2).

<Surfactant>

As for the surfactant, any of an anionic surfactant, a cationic surfactant, a nonionic surfactant and an amphoteric surfactant may be used, but the preferred surfactant is a nonionic surfactant. Examples of the nonionic surfactant which can be used include polyoxyethylene higher alkyl ethers, polyoxyethylene higher alkyl phenyl ethers, higher fatty acid diesters of polyethylene glycol, and silicon-containing or fluorine-containing surfactants. Also, the nonionic surfactant includes respective series of, as trade names, KP (produced by Shin-Etsu Chemical Co., Ltd.), Polyflow (produced by Kyoeisha Chemical Co., Ltd.), EFtop (produced by JEMCO), Megaface (produced by Dainippon Ink and Chemicals, Inc.), Florad (produced by Sumitomo 3M, Ltd.), Asahi Guard, Surflon (produced by Asahi Glass Co., Ltd.) and PolyFox (produced by OMNOVA).

One surfactant may be used alone, or two or more kinds of surfactants may be mixed and used.

The amount of the surfactant blended is usually 10 parts by mass or less, preferably from 0.01 to 10 parts by mass, more preferably from 0.01 to 1 part by mass, per total 100 parts by mass of the components (A1) and (A2).

<Plasticizer>

Examples of the plasticizer include dibutyl phthalate, dioctyl phthalate, didodecyl phthalate, polyethylene glycol, glycerin, dimethyl glycerin phthalate, dibutyl tartrate, dioctyl adipate and triacetyl glycerin.

The amount of the plasticizer blended is preferably from 0.1 to 30 parts by mass, more preferably from 1 to 10 parts by mass, per total 100 parts by mass of the components (A1) and (A2).

<Solvent>

The positive photosensitive composition of the present invention is used as a solution by dissolving the above-described components in a solvent. Examples of the solvent used for the positive photosensitive composition of the present invention include:

(a) ethylene glycol monoalkyl ethers such as ethylene glycol monomethyl ether, ethylene glycol monoethyl ether, ethylene glycol monopropyl ether and ethylene glycol monobutyl ether;

(b) ethylene glycol dialkyl ethers such as ethylene glycol dimethyl ether, ethylene glycol diethyl ether and ethylene glycol dipropyl ether;

(c) ethylene glycol monoalkyl ether acetates such as ethylene glycol monomethyl ether acetate, ethylene glycol monoethyl ether acetate, ethylene glycol monopropyl ether acetate and ethylene glycol monobutyl ether acetate;

(d) propylene glycol monoalkyl ethers such as propylene glycol monomethyl ether, propylene glycol monoethyl ether, propylene glycol monopropyl ether and propylene glycol monobutyl ether;

(e) propylene glycol dialkyl ethers such as propylene glycol dimethyl ether and propylene glycol diethyl ether;

(f) propylene glycol monoalkyl ether acetates such as propylene glycol monomethyl ether acetate, propylene glycol monoethyl ether acetate, propylene glycol monopropyl ether acetate and propylene glycol monobutyl ether acetate;

(g) diethylene glycol monoalkyl ethers such as diethylene glycol monomethyl ether and diethylene glycol monoethyl ether;

(h) diethylene glycol dialkyl ethers such as diethylene glycol dimethyl ether, diethylene glycol diethyl ether and diethylene glycol ethyl methyl ether;

(i) diethylene glycol monoalkyl ether acetates such as diethylene glycol monomethyl ether acetate, diethylene glycol monoethyl ether acetate, diethylene glycol monopropyl ether acetate and diethylene glycol monobutyl ether acetate;

(j) dipropylene glycol monoalkyl ethers such as dipropylene glycol monomethyl ether, dipropylene glycol monoethyl ether, dipropylene glycol monopropyl ether and dipropylene glycol monobutyl ether;

(k) dipropylene glycol dialkyl ethers such as dipropylene glycol dimethyl ether, dipropylene glycol diethyl ether and dipropylene glycol ethyl methyl ether;

(l) dipropylene glycol monoalkyl ether acetates such as dipropylene glycol monomethyl ether acetate, dipropylene glycol monoethyl ether acetate, dipropylene glycol monopropyl ether acetate and dipropylene glycol monobutyl ether acetate;

(m) lactic acid esters such as methyl lactate, ethyl lactate, n-propyl lactate, isopropyl lactate, n-butyl lactate, isobutyl lactate, n-amyl lactate and isoamyl lactate;

(n) aliphatic carboxylic acid esters such as n-butyl acetate, isobutyl acetate, n-amyl acetate, isoamyl acetate, n-hexyl acetate, 2-ethylhexyl acetate, ethyl propionate, n-propyl propionate, isopropyl propionate, n-butyl propionate, isobutyl propionate, methyl butyrate, ethyl butyrate, ethyl butyrate, n-propyl butyrate, isopropyl butyrate, n-butyl butyrate and isobutyl butyrate;

(o) other esters such as ethyl hydroxyacetate, ethyl 2-hydroxy-2-methylpropionate, ethyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate and ethyl pyruvate;

(p) ketones such as methyl ethyl ketone, methyl propyl ketone, methyl n-butyl ketone, methyl isobutyl ketone, 2-heptanone, 3-heptanone, 4-heptanone and cyclohexanone;

(q) amides such as N-methylformamide, N,N-dimethylformamide, N-methylacetamide, N,N-dimethylacetamide and N-methylpyrrolidone; and (r) lactones such as γ-butyrolactone.

Also, a solvent such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonal, benzyl alcohol, anisole, benzyl acetate, ethyl benzoate, diethyl oxalate, diethyl maleate, ethylene carbonate and propylene carbonate may be further added, if desired, to the solvent above.

One solvent may be used alone, or two or more kinds of solvents may be mixed and used.

The amount of the solvent blended is usually from 50 to 3,000 parts by mass, preferably from 100 to 2,000 parts by mass, more preferably from 100 to 500 parts by mass, per total 100 parts by mass of the components (A1) and (A2).

By virtue of using the positive photosensitive resin composition containing the components (A) and (B), a positive photosensitive resin composition excellent in the sensitivity, residual film ratio and aging stability can be provided, which is a positive photosensitive resin composition ensuring that when cured, a cured film excellent in the heat resistance, adhesion, transparency and the like is obtained.

<Cured Film Forming Method>

The cured film forming method using the positive photosensitive resin composition of the present invention is described below.

The positive photosensitive resin composition of the present invention is applied on a substrate and dried by heating to form a coating film on the substrate.

The obtained coating film is irradiated with an actinic ray or radiation, whereby the component (B) decomposes and an acid is generated. By the catalytic action of the acid generated, the acid-dissociable group in the constituent unit represented by formula (1) contained in the component (A1) dissociates through a hydrolysis reaction, and a carboxyl group is produced. The exposed coating film is developed by using an alkali developer, and the exposed area containing a carboxyl group-containing resin easy to dissolve in an alkali developer is thereby removed, as a result, a positive image is formed.

The reaction formula of the hydrolysis reaction is shown below.

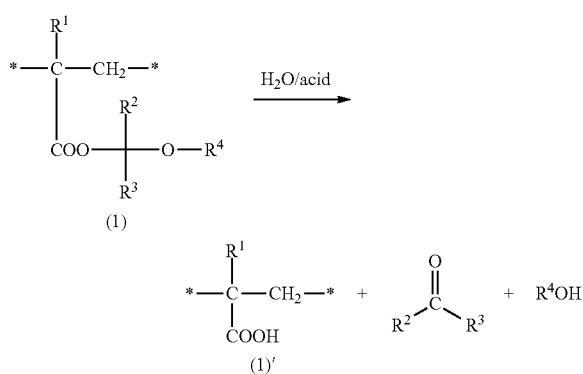

In order to accelerate the hydrolysis reaction, post exposure baking (hereinafter referred to as "PEB") may be performed, if desired. Here, if the heating temperature is high, the carboxyl group generated causes a crosslinking reaction with the constituent unit having a functional group capable of reacting with a carboxyl group to form a covalent bond, and it becomes impossible to effect development.

Actually, when tert-butyl methacrylate is used in place of the repeating unit represented by formula (1), because of high activation energy of the acid dissociation reaction, PEB must be performed at a high temperature to dissociate the acid-dissociable group, but a crosslinking reaction occurs at the same time and an image cannot be obtained.

On the other hand, the acid-dissociable group represented by formula (1) of the present invention is low in the activation energy of acid decomposition and produces a carboxyl group by readily decomposing in the presence of an acid derived from an acid generator upon exposure and therefore, PEB need not be performed, so that a positive image can be formed by development.

Incidentally, decomposition of the acid-dissociable group may be accelerated by performing PEB at a relatively low temperature without causing a crosslinking reaction.

The PEB temperature is preferably 130° C. or less, more preferably 110° C. or less, still more preferably 80° C. or less.

The obtained positive image is then heated, as a result, the acid-dissociable group in formula (1) thermally decomposes to produce a carboxyl group, and the carboxyl group is crosslinked with a structure to be crosslinked, whereby a cured film can be formed. This heating is preferably performed at a high temperature of 150° C. or more, more preferably at 180 to 250° C., still more preferably at 200 to 250° C.

The heating time may be appropriately set according to the heating temperature and the like but is generally from 10 to 90 minutes. When a step of irradiating the entire surface with an actinic ray or radiation is added before the heating step, the crosslinking reaction can be accelerated by an acid generated upon irradiation with an actinic ray or radiation.

The cured film forming method using the positive photosensitive resin composition of the present invention is specifically described below.

Preparation Method of Composition Solution:

The components (A) and (B) and other components to be blended are mixed in a predetermined ratio by an arbitrary method and dissolved with stirring to prepare a composition solution. The composition solution can also be prepared, for example, by previously dissolving each component in a solvent to obtain a solution and mixing these solutions in a predetermined ratio. The composition solution prepared in this way may be filtered using a filter or the like having a pore size of 0.2 μm and then used.

<Coating Film Forming Method>

The composition solution is applied on a predetermined substrate, and the solvent is removed by heating (hereinafter referred to as "pre-baking"), whereby a desired coating film can be formed. For example, in the production of a liquid crystal display device, examples of the substrate include a glass plate having provided thereon a polarizing plate, where a black matrix layer and a color filter layer are further provided, if desired, and a transparent electroconductive circuit layer is further provided thereon. The applying method on the substrate is not particularly limited and, for example, a method such as spraying method, roll coating method, spin coating method and slit coating method may be used.

Also, the heating conditions at the pre-baking are set such that in the unexposed area, an acid-dissociable group, for example, in the repeating unit represented by formula (1) in the component (A) is not allowed to dissociate and make the component (A) soluble in an alkali developer, and although the conditions vary depending on the kind and blending ratio of respective components, the heating is preferably performed approximately at 80 to 130° C. for 30 to 120 seconds.

<Pattern Forming Method>

The substrate having provided thereon the coating film is irradiated with an actinic ray or radiation through a mask having a predetermined pattern and after performing, if desired, a heat treatment (PEB), the exposed area is removed by using a developer to form an image pattern.

For the irradiation of an actinic ray or radiation, a low-pressure mercury lamp, a high-pressure mercury lamp, an ultrahigh-pressure mercury lamp, a chemical lamp, an excimer laser generator or the like may be used, but an actinic ray at a wavelength of 300 nm or more, such as g-line, i-line and h-line, is preferred. Also, if desired, the irradiation light may be adjusted through a spectral filter such as long wavelength cut filter, short wavelength cut filter and band pass filter.

Examples of the developer which can be used include aqueous solutions of: alkali metal hydroxides such as lithium hydroxide, sodium hydroxide and potassium hydroxide; alkali metal carbonates such as sodium carbonate and potassium carbonate; alkali metal bicarbonates such as sodium bicarbonate and potassium bicarbonate; ammonium hydroxides such as tetramethylammonium hydroxide, tetraethylammonium hydroxide and choline hydroxide; sodium silicate; or sodium metasilicate. Also, an aqueous solution obtained by adding a water-soluble organic solvent such as methanol or ethanol and a surfactant in appropriate amounts to the above-described aqueous solution of alkalis may be used as the developer.

The pH of the developer is preferably from 10.0 to 14.0.

The development time is preferably from 30 to 180 seconds, and the development method may be any of puddling, dipping and the like. After the development, washing with running water is performed for 30 to 90 seconds, whereby a desired pattern can be formed.

<Crosslinking Step>

The pattern with unexposed area obtained by development is heat-treated using a heating device such as hot plate or oven at a predetermined temperature, for example, at 180 to 250° C., for a predetermined time, for example, for 5 to 30 minutes on a hot plate or for 30 to 90 minutes in an oven, as a result, the acid-dissociable group in the component (A1) dissociates to generate a carboxyl group and the carboxyl group is allowed to react and crosslink with a structure in the component (A2) capable of crosslinking with a carboxyl group, whereby a protective film or interlayer insulating film excellent in the heat resistance, hardness and the like can be formed. Also, the transparency can be enhanced by performing the heat treatment in a nitrogen atmosphere.

Incidentally, in advance of the heat treatment, the substrate after pattern formation is preferably irradiated with an actinic ray or radiation to generate an acid from the component (B) present in the unexposed portion.

EXAMPLES

The present invention is described in greater detail below by referring to Examples, but the present invention is not limited to these Examples.

Synthesis Example 1: Synthesis of A1-1

Into a 500 ml-volume three-neck flask, 67.1 g (0.36 mol) of 1-n-butoxyethyl methacrylate, 21.1 g (0.12 mol) of benzyl methacrylate, 10.3 g (0.12 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in propylene glycol monomethyl ether acetate, and heptane and methyl isobutyl ketone contained in the solution were removed by distillation under reduced pressure to obtain Polymer A1-1 (1-n-butoxyethyl methacrylate/benzyl methacrylate/methacrylic acid) as a propylene glycol monomethyl ether acetate solution.

As for the molecular weight and molecular weight distribution of the polymer obtained, GPC measurement using polystyrene as the standard revealed that the weight average molecular weight was about 8,000 and the molecular weight distribution (Mw/Mn) was 1.8.

Synthesis Example 2: Synthesis of A1-2

Into a 500 ml-volume three-neck flask, 105.7 g (0.48 mol) of 1-benzyloxyethyl methacrylate, 7.8 g (0.06 mol) of 2-hydroxyethyl methacrylate, 5.2 g (0.06 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A1-2 (1-benzyloxyethyl methacrylate/2-hydroxyethyl methacrylate/methacrylic acid) as a diethylene glycol dimethyl ether solution.

As for the molecular weight and molecular weight distribution of the polymer obtained, GPC measurement using polystyrene as the standard revealed that the weight average molecular weight was about 4,000 and the molecular weight distribution (Mw/Mn) was 1.6.

Synthesis Example 3: Synthesis of A1-3

Into a 500 ml-volume three-neck flask, 66.4 g (0.42 mol) of 1-ethoxyethyl methacrylate, 21.1 g (0.12 mol) of benzyl methacrylate, 7.8 g (0.06 mol) of 2-hydroxyethyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol ethyl methyl ether, and heptane and methyl isobutyl ketone contained in the solution were removed by distillation under reduced pressure to obtain Polymer A1-3 (1-ethoxyethyl methacrylate/benzyl methacrylate/2-hydroxyethyl methacrylate) as a diethylene glycol ethyl methyl ether solution.

As for the molecular weight and molecular weight distribution of the polymer obtained, GPC measurement using polystyrene as the standard revealed that the weight average molecular weight was about 4,000 and the molecular weight distribution (Mw/Mn) was 1.6.

Synthesis Example 4: Synthesis of A1-4

Into a 500 ml-volume three-neck flask, 51.9 g (0.36 mol) of 1-ethoxyethyl acrylate, 31.7 g (0.18 mol) of benzyl methacrylate, 7.8 g (0.06 mol) of 2-hydroxyethyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in propylene glycol monomethyl ether acetate, and heptane and methyl isobutyl ketone contained in the solution were removed by distillation under reduced pressure to obtain Polymer A1-4 (1-ethoxyethyl acrylate/benzyl methacrylate/2-hydroxyethyl methacrylate) as a propylene glycol monomethyl ether acetate solution.

As for the molecular weight and molecular weight distribution of the polymer obtained, GPC measurement using polystyrene as the standard revealed that the weight average molecular weight was about 5,000 and the molecular weight distribution (Mw/Mn) was 1.7.

Synthesis Example 5: Synthesis of A1-5

Into a 500 ml-volume three-neck flask, 28.5 g (0.18 mol) of 1-ethoxyethyl methacrylate, 52.9 g (0.30 mol) of benzyl methacrylate, 10.3 g (0.12 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A1-5 (1-ethoxyethyl methacrylate/benzyl methacrylate/methacrylic acid) as a diethylene glycol dimethyl ether solution.

As for the molecular weight and molecular weight distribution of the polymer obtained, GPC measurement using polystyrene as the standard revealed that the weight average molecular weight was about 12,000 and the molecular weight distribution (Mw/Mn) was 1.8.

Synthesis Example 6: Synthesis of A1-6

Into a 500 ml-volume three-neck flask, 63.7 g (0.30 mol) of 1-cyclohexyloxyethyl methacrylate, 40.3 g (0.30 mol) of p-methoxystyrene and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol ethyl methyl ether, and heptane and methyl isobutyl ketone contained in the solution were removed by distillation under reduced pressure to obtain Polymer A1-6 (1-cyclohexyloxyethyl methacrylate/p-methoxystyrene) as a diethylene glycol ethyl methyl ether solution.

As for the molecular weight and molecular weight distribution of the polymer obtained, GPC measurement using polystyrene as the standard revealed that the weight average molecular weight was about 8,000 and the molecular weight distribution (Mw/Mn) was 1.7.

Synthesis Example 7: Synthesis of A1-7

Into a 500 ml-volume three-neck flask, 71.5 g (0.42 mol) of 2-tetrahydropyranyl methacrylate, 19.5 g (0.12 mol) of p-acetoxystyrene, 7.8 g (0.06 mol) of 2-hydroxyethyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in a mixed solvent of propylene glycol monomethyl ether acetate and diethylene glycol ethyl methyl ether, and heptane and methyl isobutyl ketone contained in the solution were removed by distillation under reduced pressure to obtain Polymer A1-7 (2-tetrahydropyranyl methacrylate/p-acetoxystyrene/2-hydroxyethyl methacrylate) as a solution in a mixed solvent of propylene glycol monomethyl ether acetate and diethylene glycol ethyl methyl ether.

As for the molecular weight and molecular weight distribution of the polymer obtained, GPC measurement using polystyrene as the standard revealed that the weight average molecular weight was about 6,000 and the molecular weight distribution (Mw/Mn) was 1.7.

Synthesis Example 8: Synthesis of A2-1

Into a 500 ml-volume three-neck flask, 51.2 g (0.36 mol) of glycidyl methacrylate, 42.3 g (0.24 mol) of benzyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-1 (glycidyl methacrylate/benzyl methacrylate) as a diethylene glycol dimethyl ether solution.

As for the molecular weight and molecular weight distribution of the polymer obtained, GPC measurement using polystyrene as the standard revealed that the weight average molecular weight was about 8,000 and the molecular weight distribution (Mw/Mn) was 1.7.

Synthesis Example 9: Synthesis of A2-2

Into a 500 ml-volume three-neck flask, 46.1 g (0.36 mol) of glycidyl acrylate, 15.6 g (0.12 mol) of 2-hydroxyethyl methacrylate, 19.5 g (0.12 mol) of p-acetoxystyrene and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-2 (glycidyl acrylate/2-hydroxyethyl methacrylate/p-acetoxystyrene) as a diethylene glycol dimethyl ether solution.

As for the molecular weight and molecular weight distribution of the polymer obtained, GPC measurement using polystyrene as the standard revealed that the weight average molecular weight was about 5,000 and the molecular weight distribution (Mw/Mn) was 1.6.

Synthesis Example 10: Synthesis of A2-3

Into a 500 ml-volume three-neck flask, 58.9 g (0.30 mol) of 3,4-epoxycyclohexylmethyl methacrylate (Cyclomer M100, produced by Daicel Chemical Industries, Ltd.), 31.7 g (0.18 mol) of benzyl methacrylate, 10.3 g (0.12 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-3 (3,4-epoxycyclohexylmethyl methacrylate/benzyl methacrylate/methacrylic acid) as a diethylene glycol dimethyl ether solution.

As for the molecular weight and molecular weight distribution of the polymer obtained, GPC measurement using polystyrene as the standard revealed that the weight average molecular weight was about 7,000 and the molecular weight distribution (Mw/Mn) was 1.7.

Synthesis Example 11: Synthesis of A2-4

Into a 500 ml-volume three-neck flask, 52.9 g (0.30 mol) of p-vinylphenyl glycidyl ether, 19.0 g (0.12 mol) of 1-ethoxyethyl methacrylate, 29.2 g (0.18 mol) of p-acetoxystyrene and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-4 (p-vinylphenyl glycidyl ether/1-ethoxyethyl methacrylate/p-acetoxystyrene) as a diethylene glycol dimethyl ether solution.

As for the molecular weight and molecular weight distribution of the polymer obtained, GPC measurement using polystyrene as the standard revealed that the weight average molecular weight was about 4,000 and the molecular weight distribution (Mw/Mn) was 1.6.

Synthesis Example 12: Synthesis of A2-5

Into a 500 ml-volume three-neck flask, 34.1 g (0.24 mol) of glycidyl methacrylate, 38.0 g (0.24 mol) of i-ethoxyethyl methacrylate, 15.6 g (0.12 mol) of 2-hydroxyethyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-5 (glycidyl methacrylate/1-ethoxyethyl methacrylate/2-hydroxyethyl methacrylate) as a diethylene glycol dimethyl ether solution.

As for the molecular weight and molecular weight distribution of the polymer obtained, GPC measurement using polystyrene as the standard revealed that the weight average molecular weight was about 9,000 and the molecular weight distribution (Mw/Mn) was 1.7.

Synthesis Example 13: Synthesis of A2-6

Into a 500 ml-volume three-neck flask, 34.1 g (0.24 mol) of glycidyl methacrylate, 28.5 g (0.18 mol) of 1-ethoxyethyl methacrylate, 7.8 g (0.06 mol) of 2-hydroxyethyl methacrylate, 21.1 g (0.12 mol) of benzyl methacrylate and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-6 (glycidyl methacrylate/1-ethoxyethyl methacrylate/2-hydroxyethyl methacrylate/benzyl methacrylate) as a diethylene glycol dimethyl ether solution.

As for the molecular weight and molecular weight distribution of the polymer obtained, GPC measurement using polystyrene as the standard revealed that the weight average molecular weight was about 8,000 and the molecular weight distribution (Mw/Mn) was 1.7.

Synthesis Example 14: Synthesis of A2-7

Into a 500 ml-volume three-neck flask, 51.2 g (0.36 mol) of glycidyl methacrylate, 21.1 g (0.12 mol) of benzyl methacrylate, 10.3 g (0.12 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in diethylene glycol dimethyl ether, and heptane and methyl isobutyl ketone contained in the solution were removed by distillation under reduced pressure to obtain Polymer A2-7 (glycidyl methacrylate/benzyl methacrylate/methacrylic acid) as a diethylene glycol dimethyl ether solution.

As for the molecular weight and molecular weight distribution of the polymer obtained, GPC measurement using polystyrene as the standard revealed that the weight average molecular weight was about 4,000 and the molecular weight distribution (Mw/Mn) was 1.6.

Comparative Synthesis Example 1: Synthesis of A'1-8

Into a 500 ml-volume three-neck flask, 51.2 g (0.36 mol) of tert-butyl methacrylate, 21.1 g (0.12 mol) of benzyl methacrylate, 10.3 g (0.12 mol) of methacrylic acid and 300 ml of methyl isobutyl ketone were charged. A catalytic amount of 2,2'-azobis(methyl 2-methylpropionate) was added thereto as a radical polymerization initiator, and polymerization was allowed to proceed at 80° C. for 6 hours in a nitrogen stream. The reaction solution was cooled and then poured in a large amount of heptane to precipitate a polymer. The crystal was collected by filtration and dissolved in propylene glycol monomethyl ether acetate, and heptane and methyl isobutyl ketone contained in the solution were removed by distillation under reduced pressure to obtain Polymer A'1-8 (tert-butyl methacrylate/benzyl methacrylate/methacrylic acid) as a propylene glycol monomethyl ether acetate solution.

As for the molecular weight and molecular weight distribution of the polymer obtained, GPC measurement using polystyrene as the standard revealed that the weight average molecular weight was about 8,000 and the molecular weight distribution (Mw/Mn) was 1.6.

Comparative Synthesis Example 2: Synthesis of A'1-9

Into a 500 ml-volume three-neck flask, 72.1 g of poly-4-hydroxystyrene (VP-8000, produced by Nippon Soda Co., Ltd.), 16.4 g of ethyl vinyl ether and 300 ml of ethyl acetate were charged. A catalytic amount of para-toluenesulfonic acid was added thereto, and reaction was allowed to proceed at room temperature for 3 hours in a nitrogen stream. After adding a small amount of triethylamine, the mixture was washed with pure water. Propylene glycol monomethyl ether acetate was added to the ethyl acetate layer, and ethyl acetate was removed by distillation under reduced pressure to obtain Polymer A'1-9 (p-1-ethoxyethoxystyrene/p-hydroxystyrene) as a propylene glycol monomethyl ether acetate solution.

In the polymer obtained, from NMR measurement, the constituent ratio between p-1-ethoxyethoxystyrene unit and p-hydroxystyrene unit was about 35:65. Also, GPC measurement using polystyrene as the standard revealed that the weight average molecular weight was about 9,000 and the molecular weight distribution (Mw/Mn) was 1.2.

Comparative Synthesis Example 3: Synthesis of A'-10

Synthesis of A'-10 was performed in accordance with Synthesis Example 1 of JP-A-2004-264623.

Into a three-neck flask, 7 parts by mass of 2,2'-azobis(2, 4-dimethylvaleronitrile) and 200 parts by mass of diethylene glycol ethyl methyl ether were charged and subsequently, 40 parts by mass of 1-(cyclohexyloxy)ethyl methacrylate, 5 parts by mass of styrene, 45 parts by mass of glycidyl methacrylate, 10 parts by mass of 2-hydroxyethyl methacrylate and 3 parts by mass of α-methylstyrene dimer were charged. After nitrogen substitution, stirring was gently started. The temperature of the solution was raised to 70° C., and this temperature was kept for 5 hours to obtain a polymer solution containing Copolymer (A'-10).

As for the molecular weight of the polymer obtained, GPC measurement using polystyrene as the standard revealed that the weight average molecular weight was about 11,000 and the molecular weight distribution (Mw/Mn) was 1.9.

Examples 1 to 9 and Comparative Examples 1 to 6

(1) Preparation of Positive Photosensitive Resin Composition Solution

A uniform solution was obtained by mixing the components shown in Table 1 below and then filtered using a polytetrafluoroethylene-made filter having a pore size of 0.2 µm to prepare a positive photosensitive resin composition solution.

(2) Evaluation of Storage Stability

The viscosity at 23° C. of the positive photosensitive resin composition solution was measured using an E-type viscometer manufactured by Toki Sangyo Co., Ltd. Also, the viscosity of the composition after storage in a constant temperature bath at 23° C. for one month was measured. The storage stability was rated A when the increase of viscosity after storage at room temperature for one month based on the viscosity after the preparation was less than 5%, and rated B when 5% or more. The results are shown in Table 2 below.

(3) Evaluation of Sensitivity and Residual Film Ratio at Development

The positive photosensitive resin composition solution was applied on a silicon wafer having thereon a silicon oxide film by spin-coating and then pre-baked on a hot plate at 100° C. for 60 seconds to form a 3 µm-thick coating film.

The coating film was then exposed through a predetermined mask by using an i-line stepper (FPA-3000i5+, manufactured by Canon Inc.), baked at 50° C. for 60 seconds, developed with the alkali developer shown in Table 2 (an aqueous 2.38 mass % or 0.4 mass % tetramethylammonium hydroxide solution) at 23° C. for 60 seconds and then rinsed with ultrapure water for 1 minute. The optimal exposure dose (Eopt) when resolving a 5-µm line-and-space at 1:1 by these operations was taken as the sensitivity.

The film thickness of the unexposed area after development was measured, and the ratio to the film thickness after coating (film thickness of unexposed area after development÷film thickness after coating×100(%)) was determined, whereby the residual film ratio at the development was evaluated.

The evaluation results of sensitivity and residual film ratio at development are shown in Table 2.

(4) Evaluation of Heat Resistance, Transmittance and Adhesion

A coating film was formed in the same manner as in (3) above except that in (3) above, a transparent substrate (Corning 1737, produced by Corning Inc.) was used in place of the silicon wafer having thereon a silicon oxide film. The coating film was exposed to an ultraviolet ray at 365 nm and a light intensity of 18 mW/cm$^2$ by using a proximity exposure device (UX-1000SM, manufactured by Ushio Inc.) while tightly contacting a predetermined mask with the coating film, then developed with an alkali developer (an aqueous 2.38 mass % tetramethylammonium hydroxide solution) at 23° C. for 60 seconds, and rinsed with ultrapure water for 1 minute. By these operations, a pattern of 10-µm line-and-space at 1:1 was formed. The obtained pattern was further subjected to entire surface exposure for 100 seconds and then heated in an oven at 220° C. for 1 hour to form a heat-cured film on a glass substrate. Also, the pattern after the above-described entire surface exposure for 100 seconds was heated in an oven at 240° C. for 1 hour, whereby a heat-cured film was similarly formed on a glass substrate.

The heat resistance was evaluated by measuring the rate of change in the bottom dimension between before and after heat curing (1−bottom dimension of heat-cured film÷bottom dimension after development)×100(%). The heat resistance was rated A when the rate of change was less than 5%, and rated B when 5% or more.

The transmittance of the heat-cured film obtained by the heating at 220° C. for 1 hour was measured by a spectrophotometer (U-3000, manufactured by Hitachi, Ltd.) in the wavelength range of 400 to 800 nm. The transmittance was rated A when the minimum transmittance exceeded 95%, rated B when from 90 to 95%, and rated C when less than 90%.

On the other hand, the transmittance of the heat-cured film obtained by the heating at 240° C. for 1 hour was measured by a spectrophotometer (U-3000, manufactured by Hitachi, Ltd.) in the wavelength range of 400 to 800 nm, and the minimum transmittance was determined. Furthermore, the film thickness was measured using DEKTAK-3 manufactured by ULVAC, and the transmittance per film thickness of 1 µm was determined.

The heat-cured film obtained by the heating at 220° C. for 1 hour was incised vertically and horizontally by a cutter at intervals of 1 mm, and a tape peeling test was performed using Scotch Tape. The adhesion between the cured film and the substrate was evaluated from the area of the cured film transferred to the back surface of the tape. The adhesion was rated A when the area was less than 1%, rated B when from 1 to less than 5%, and rated C when 5% or more.

The evaluation results of heat resistance, transmittance and adhesion are shown in Table 2.

TABLE 1

| | Component (A) | | | | Component (B) | | Component (C) | | Basic Compound | | Solvent | | |
| | Kind (A1) | Kind (A2) | Blending Ratio of Resins (A1:A2) | Parts by mass | Kind | Parts by mass | Kind | Parts by mass | Kind | Parts by mass | Kind | Parts by mass | Surfactant |
|---|---|---|---|---|---|---|---|---|---|---|---|---|---|
| Example 1 | A1-1 | A2-1 | 50:50 | 100 | B1 | 3.0 | C1 | 2.1 | D1 | 0.02 | E1 | 160 | F1 0.05 |
| Example 2 | A1-2 | A2-2 | 50:50 | 100 | B2 | 2.8 | C2 | 2.1 | D2 | 0.02 | E2 | 160 | F1 0.05 |
| Example 3 | A1-3 | A2-3 | 50:50 | 100 | B3 | 2.5 | C3 | 2.1 | D1 | 0.02 | E3 | 160 | F2 0.05 |
| Example 4 | A1-4 | A2-4 | 50:50 | 100 | B4 | 2.5 | C1 | 2.1 | D2 | 0.02 | E1 | 160 | F2 0.05 |
| Example 5 | A1-5 | A2-5 | 50:50 | 100 | B1 + B4 | B1: 1.3 + B4: 1.3 | C1 | 2.1 | D1 | 0.02 | E2 | 120 | F3 0.05 |
| Example 6 | A1-6 | A2-6 | 50:50 | 100 | B1 | 2.8 | C1 | 2.1 | D1 | 0.02 | E3 | 120 | F3 0.05 |
| Example 7 | A1-7 | A2-7 | 50:50 | 100 | B1 | 3.0 | C1 | 2.1 | D1 | 0.02 | E1 + E3 | E1: 80 + E3: 80 | F1 0.05 |
| Example 8 | A1-1 | A2-6 | 60:40 | 100 | B2 | 3.0 | C1 | 2.1 | D1 | 0.02 | E1 | 160 | F1 0.05 |
| Example 9 | A1-3 | A2-5 | 30:70 | 100 | B2 | 3.0 | — | — | D1 | 0.02 | E3 | 160 | F1 0.05 |
| Comparative Example 1 | A1-1 | — | 100:0 | 100 | B1 | 3.0 | C1 | 2.1 | D1 | 0.02 | E1 | 120 | F1 0.05 |
| Comparative Example 2 | — | A2-1 | 0:100 | 100 | B1 | 3.0 | C1 | 2.1 | D1 | 0.02 | E1 | 120 | F1 0.05 |

TABLE 1-continued

| | Component (A) | | | | Component (B) | | Component (C) | | Basic Compound | | Solvent | | | |
|---|---|---|---|---|---|---|---|---|---|---|---|---|---|---|
| | Kind (A1) | Kind (A2) | Blending Ratio of Resins (A1:A2) | Parts by mass | Kind | Parts by mass | Kind | Parts by mass | Kind | Parts by mass | Kind | Parts by mass | Surfactant | |
| Comparative Example 3 | A'1-8 | A2-1 | 50:50 | 100 | B1 | 3.0 | C1 | 2.1 | D1 | 0.02 | E1 | 120 | F1 | 0.05 |
| Comparative Example 4 | A'1-9 | — | 100:0 | 100 | B1 | 3.0 | C1 | 2.1 | D1 | 0.02 | E1 | 120 | F1 | 0.05 |
| Comparative Example 5 | A'-10 | — | — | 100 | B'6 | 10.0 | — | — | — | — | E3 | 257 | — | — |
| Comparative Example 6 | A'-10 | — | — | 100 | B'6 | 5.0 | — | — | — | — | E3 | 245 | — | — |

The components (A), (B) and (C), basic compounds and solvents shown in Table 1 are as follows.

Component (A):

The numerical value on the right side of the constituent unit indicates the molar ratio of the constituent unit.

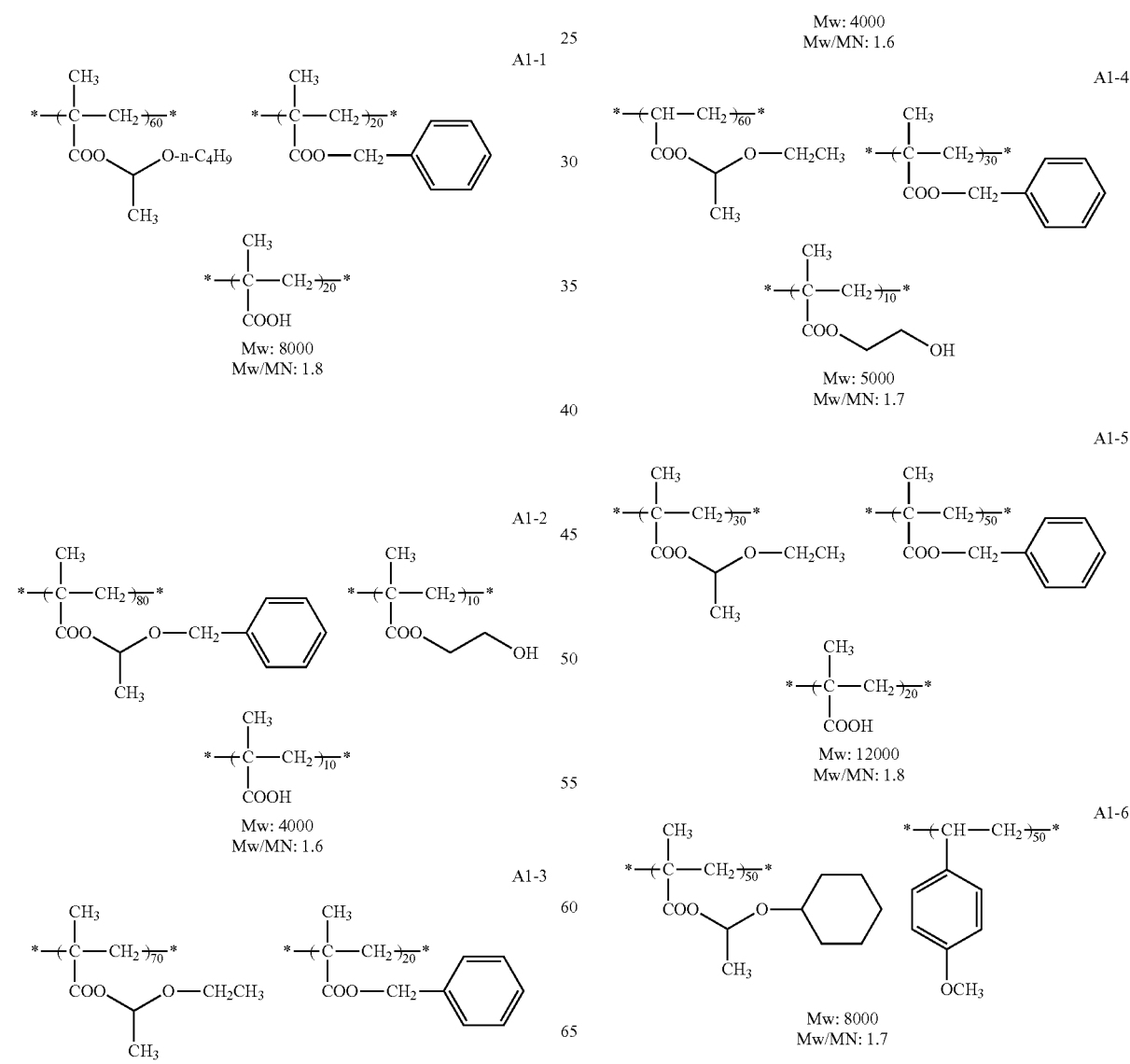

-continued
A1-7
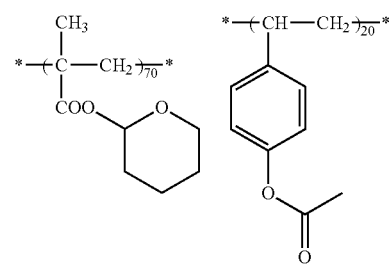
Mw: 6000
Mw/MN: 1.7
A'1-8
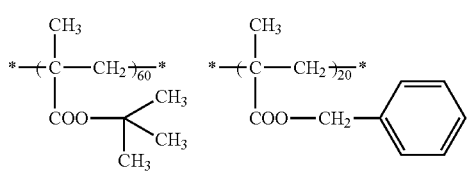
Mw: 8000
Mw/MN: 1.6
A'1-9
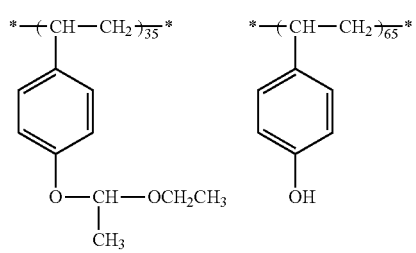
Mw: 9000
Mw/MN: 1.2
A'-10
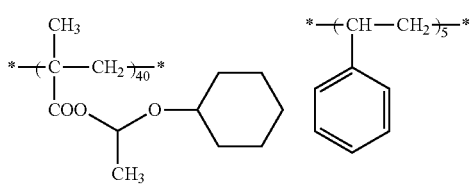
Mw: 11000
Mw/MN: 1.9
-continued
A2-1
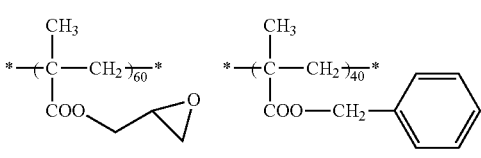
Mw: 8000
Mw/MN: 1.7
A2-2
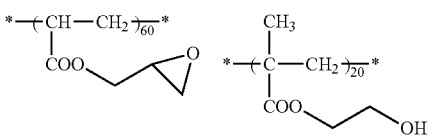
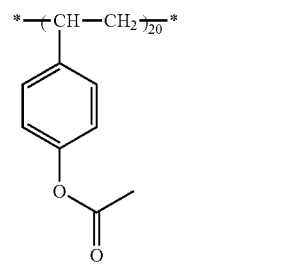
Mw: 5000
Mw/MN: 1.6
A2-3
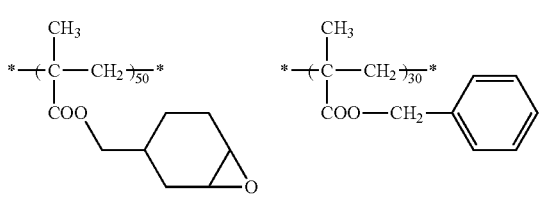
Mw: 7000
Mw/MN: 1.7
A2-4
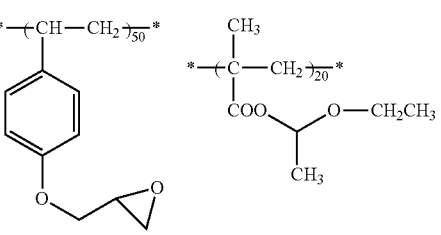
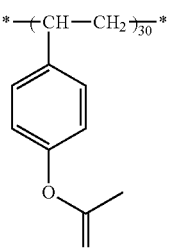
Mw: 4000
Mw/MN: 1.6

A2-5

[Copolymer structure: two units, each *-(C(CH₃)-CH₂)₄₀-*; first unit has COO-CH₂-(oxirane), second unit has COO-CH(CH₃)-O-CH₂CH₃]

[Polymer: *-(C(CH₃)-CH₂)₂₀-* with COO-CH₂CH₂-OH]

Mw: 9000
Mw/MN: 1.7

A2-6

[Copolymer: *-(C(CH₃)-CH₂)₄₀-* with COO-CH₂-(oxirane); and *-(C(CH₃)-CH₂)₃₀-* with COO-CH(CH₃)-O-CH₂CH₃]

[Copolymer: *-(C(CH₃)-CH₂)₁₀-* with COO-CH₂CH₂-OH; and *-(C(CH₃)-CH₂)₂₀-* with COO-CH₂-phenyl]

Mw: 8000
Mw/MN: 1.7

A2-7

[Copolymer: *-(C(CH₃)-CH₂)₆₀-* with COO-CH₂-(oxirane); and *-(C(CH₃)-CH₂)₂₀-* with COO-CH₂-phenyl]

[Polymer: *-(C(CH₃)-CH₂)₂₀-* with COOH]

Mw: 4000
Mw/MN: 1.6

Component (B):

B1

IRGACURE PAG 103 (produced by Ciba Specialty Chemicals Corp.)

B2

IRGACURE PAG 108 (produced by Ciba Specialty Chemicals Corp.)

B3

CGI 1380 (produced by Ciba Specialty Chemicals Corp.)

B4

IRGACURE PAG 121 (produced by Ciba Specialty Chemicals Corp.)

B5

CGI 725 (produced by Ciba Specialty Chemicals Corp.)

B6

4,7-di-n-butoxy-1-naphthyltetrahydrothiophenium triflouromethanesulfonate

Component (C):

C1: γ-glycidoxypropyltrimethoxysilane
C2: β-(3,4-epoxycyclohexyl)ethyltrimethoxysilane
C3: γ-methacryloxypropyltrimethoxysilane

[Basic Compound]

D1: 4-dimethylaminopyridine
D2: 1,5-diazabicyclo[4,3,0]-5-nonene

[Solvent]

E1: propylene glycol monomethyl ether acetate
E2: diethylene glycol dimethyl ether
E3: diethylene glycol ethyl methyl ether

[Surfactant]

F1: Florad F-430 (produced by Sumitomo 3M, Ltd.)
F2: Megaface R-08 (produced by Dainippon Ink and Chemicals, Inc.)
F3: PolyFox PF-6320 (produced by OMNOVA)

TABLE 2

| | Concentration of Developer (mass %) | Storage Stability | Sensitivity (Eopt) (mJ/cm$^2$) | Residual Film Ratio (%) | Heat Resistance | Adhesion | Transmittance (after heating at 220° C. for 1 hour) | Transmittance (after heating at 240° C. for 1 hour) |
|---|---|---|---|---|---|---|---|---|
| Example 1 | 2.38 | A | 48 | 99 | A | A | A | 98% |
| Example 2 | 2.38 | A | 49 | 99 | A | A | A | 96% |
| Example 3 | 2.38 | A | 52 | 98 | A | A | A | 97% |
| Example 4 | 2.38 | A | 51 | 98 | A | A | A | 96% |
| Example 5 | 2.38 | A | 52 | 99 | A | A | A | 98% |
| Example 6 | 2.38 | A | 50 | 99 | A | A | A | 96% |
| Example 7 | 2.38 | A | 52 | 99 | A | A | A | 97% |
| Example 8 | 0.4 | A | 55 | 99 | A | A | A | 98% |
| Example 9 | 0.4 | A | 57 | 99 | A | A | A | 98% |
| Comparative Example 1 | 2.38 | A | 49 | 98 | B | A | A | 98% |
| Comparative Example 2 | 2.38 | A | Image was not formed. | | A | A | 98% |
| Comparative Example 3 | 2.38 | A | Image was not formed. | | A | A | 97% |
| Comparative Example 4 | 2.38 | A | 51 | 97 | B | A | B | 70% |
| Comparative Example 5 | 2.38 | A | >800 | 99 | A | C | A | 85% |
| Comparative Example 6 | 0.4 | A | >800 | 99 | A | C | A | 86% |

As apparent from Table 2, the positive photosensitive resin composition of the present invention is excellent in the sensitivity, residual film ratio and storage stability and when cured, can form a cured film excellent in the heat resistance, adhesion, transmittance and the like.

The positive photosensitive resin composition of the present invention is assured of high sensitivity, so that a liquid crystal display device, an integrated circuit device, a solid-state imaging device or an organic EL device can be efficiently produced.

A liquid crystal display device obtained using the positive photosensitive resin composition of the present invention is high in the transmittance and can reduce the power consumption.

INDUSTRIAL APPLICABILITY

The positive photosensitive resin composition of the present invention ensures that a coating film excellent in the sensitivity, residual film ratio and storage stability is obtained and when cured, a cured film excellent in the heat resistance, adhesion, transmittance and the like is obtained. The pattern forming method of the present invention is suitably used for the formation of a flattening film, a protective film or an interlayer insulating film of electronic components such as liquid crystal display device, integrated circuit device, solid-state imaging device and organic EL.

While the invention has been described in detail and with reference to specific embodiments thereof, it will be apparent to one skilled in the art that various changes and modifications can be made therein without departing from the spirit and scope thereof.

This application is based on Japanese Patent Application (Patent Application No. 2007-256203) filed on Sep. 28, 2007 and Japanese Patent Application (Patent Application No. 2008-246883) filed on Sep. 25, 2008, the contents of which are incorporated herein by way of reference.

The invention claimed is:

1. A positive photosensitive resin composition comprising:

(A1) a resin containing a constituent unit represented by the following formula (1) having an acid-dissociable group, the resin being alkali-insoluble or sparingly alkali-soluble and becoming alkali-soluble when said acid-dissociable group dissociates;

(A2) a resin containing a constituent unit having a functional group capable of reacting with a carboxyl group to form a covalent bond and a constituent unit represented by formula (1); and (B) a compound capable of generating an acid upon irradiation with an actinic ray or radiation:

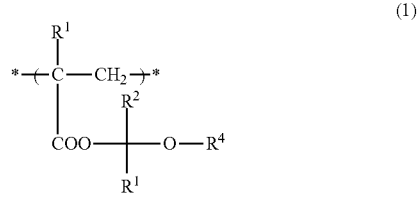

(1)

wherein $R^1$ represents a hydrogen atom, a methyl group, a halogen atom or a cyano group, each of $R^2$ and $R^3$ independently represents a hydrogen atom, a linear or branched alkyl group, or a cycloalkyl group, provided that at least one of $R^2$ and $R^3$ represents a linear or branched alkyl group or a cycloalkyl group, $R^4$ represents a linear or branched alkyl group which may be substituted, a cycloalkyl group which may be substituted, or an aralkyl group which may be substituted, and $R^2$ or $R^3$ may combine with $R^4$ to form cyclic ether, wherein the component (A2) contains a constituent unit represented by the following formula (3)':

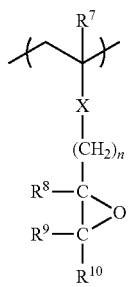

wherein

X represents a divalent linking group,

R⁷ represents a hydrogen atom, a methyl group or a halogen atom, each of R⁸, R⁹ and R¹⁰ independently represents a hydrogen atom or an alkyl group, and n is an integer of 1 to 10.

2. The positive photosensitive resin composition as claimed in claim 1, wherein
the component (B) is a compound capable of generating an acid upon irradiation with an actinic ray at a wavelength of 300 nm or more.

3. The positive photosensitive resin composition as claimed in claim 1, wherein
the component (B) is a compound containing an oxime sulfonate group represented by the following formula (2):

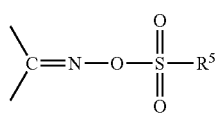

wherein

R⁵ represents a linear or branched alkyl group which may be substituted, a cycloalkyl group which may be substituted, or an aryl group which may be substituted.

4. The positive photosensitive resin composition as claimed in claim 3, wherein the component (B) is a compound represented by the following formula (3):

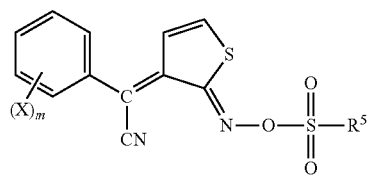

wherein

R⁵ is the same as R⁵ in formula (2),

X represents a linear or branched alkyl group, an alkoxy group or a halogen atom, m represents an integer of 0 to 3, and when m is 2 or 3, each X may be same as or different from every other X.

5. The positive photosensitive resin composition as claimed in claim 1, further comprising:
(C) an adhesion aid.

6. A cured film forming method comprising:
a step of applying the positive photosensitive resin composition claimed in claim 1 on a substrate and drying it to form a coating film;
a step of exposing the coating film to an actinic ray or radiation through a mask;
a step of developing the exposed film with an alkali developer to form a pattern; and
a step of heat-treating the obtained pattern.

7. The cured film forming method as claimed in claim 6, further comprising:
a step of exposing the entire surface of the film, after the step of developing the coating film with an alkali developer to form a pattern but before the step of heat-treating the obtained pattern.

8. A cured film formed by using the cured film forming method claimed in claim 6.

9. A liquid crystal display device having the cured film claimed in claim 8.

10. An integrated circuit device having the cured film claimed in claim 8.

11. A solid-state imaging device having the cured film claimed in claim 8.

12. An organic EL device having the cured film claimed in claim 8.

* * * * *